US006452217B1

(12) United States Patent
Wojnarowski et al.

(10) Patent No.: US 6,452,217 B1
(45) Date of Patent: Sep. 17, 2002

(54) HIGH POWER LED LAMP STRUCTURE USING PHASE CHANGE COOLING ENHANCEMENTS FOR LED LIGHTING PRODUCTS

(75) Inventors: Robert J. Wojnarowski, Ballston Lake; William P. Minnear, Clifton Park, both of NY (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 09/607,700

(22) Filed: Jun. 30, 2000

(51) Int. Cl.[7] .......................... H01L 33/00; F21V 29/00; F21V 7/00
(52) U.S. Cl. .............................. 257/99; 257/88; 257/98; 257/100; 362/555; 362/294; 362/297
(58) Field of Search ................................ 257/88, 98, 99, 257/100; 362/555, 339, 296, 241, 252, 341, 327, 329, 800, 293, 260, 294, 7

(56) References Cited

U.S. PATENT DOCUMENTS

| | | | | |
|---|---|---|---|---|
| 4,170,399 A | * | 10/1979 | Hansen et al. | 350/96 |
| 4,849,803 A | * | 7/1989 | Yamamoto et al. | 357/72 |
| 5,119,174 A | * | 6/1992 | Chen | 357/80 |
| 5,177,500 A | * | 1/1993 | Ng | 346/107 |
| 5,225,023 A | | 7/1993 | Wojnarowski et al. | |
| 5,339,198 A | * | 8/1994 | Wheatly et al. | 359/359 |
| 5,612,576 A | * | 3/1997 | Wilson et al. | 257/788 |
| 5,614,763 A | * | 3/1997 | Womack | 257/747 |
| 5,760,479 A | * | 6/1998 | Yang et al. | 257/778 |
| 5,864,171 A | * | 1/1999 | Yamamoto et al. | 257/628 |
| 5,909,056 A | * | 6/1999 | Mertol | 257/704 |
| 6,022,759 A | * | 2/2000 | Seki | 438/123 |
| 6,084,250 A | * | 7/2000 | Juestel | 257/89 |
| 6,149,283 A | * | 11/2000 | Conway et al. | 362/236 |
| 6,220,722 B1 | * | 4/2001 | Begemann | 362/231 |

FOREIGN PATENT DOCUMENTS

JP 404299848 A * 10/1992 ................. 257/730

* cited by examiner

Primary Examiner—Nathan J. Flynn
Assistant Examiner—Johannes Mondt
(74) Attorney, Agent, or Firm—Fay, Sharpe, Fagan, Minnich & McKee, LLP

(57) ABSTRACT

High power LED lamps for use in lighting products, such as flashlights and the like, are formed of a plurality of LED die arranged in a multi-dimensional array, each of the LED die having a gallium nitride semiconductor layer and phosphor material for creation of white light. Each of the LED die emits light from the top, bottom and sides of the die and is arranged on the multi-dimensional array so that the emitted light from each of the die does not contact another die. A reflector gathers and focuses the light from each of the die to approximate a high power LED lamp. A thermally conducting, electrically insulating material or phase change material is incorporated into the lamp to act as a source of heat removal.

18 Claims, 11 Drawing Sheets

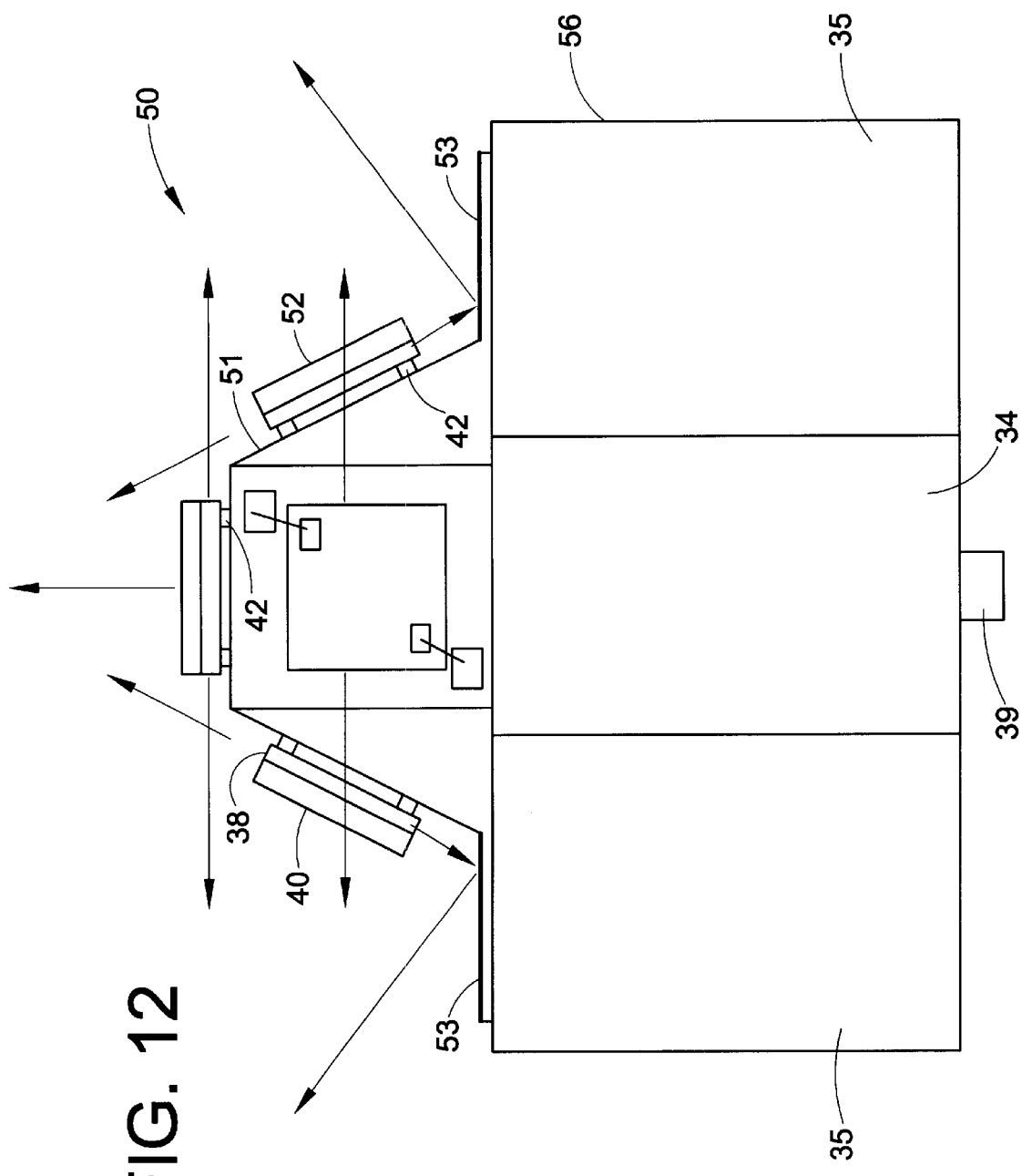

HIGH POWER LED LAMP STRUCTURE USING PHASE CHANGE COOLING ENHANCEMENTS FOR LED LIGHTING PRODUCTS

BACKGROUND OF THE INVENTION

1. Field of the Invention

This invention pertains to high power LED devices for use in lighting products. More particularly, the invention relates to a high power LED lamp or multiple LED lamp design for use in lighting products and a source of heat removal therefrom.

2. Discussion of the Art

Current state of the art light emitting diode (LED) technology is less than 10 percent efficient in the visible spectra. The LED lamps of the GaN (gallium nitride) technology create white light by the conversion of blue or UV spectral emissions using phosphors and dyes to convert light into the white spectra.

The light output for a single LED is below that of known incandescent lamps, which are approximately 30 percent efficient in the visible spectra. Flashlights, using incandescent bulbs, have approximately 20 lumens of light output. An LED device having a comparable light output power density necessitates a larger LED design or a design comprising a multiple LED configuration. Further, a new source of heat removal is also required as the battery cannot be the sole heat removal source, since it will heat up and create hazardous conditions in the battery, such as thermal runaway, excessive heating of the battery chemicals, thus causing chemical leaking, burns, corrosion, and fire.

Moreover, an alternate form of direct energy absorbing cooling must be incorporated into the lamp housing, or inserted into the battery containment area, to handle the temperature rise in both the hand or other holding means as well as the LED device itself More particularly, the LED device becomes less efficient when heated to a temperature greater than 100° C., thus creating a declining return in the visible spectra. The intrinsic phosphor conversion efficiency therefore drops dramatically as the temperature increases above an approximately 90° C. threshold.

Thus, there is a particular need for an improved high power LED device for use in lighting products, such as flashlights and the like, which is capable of a light output of about 20 lumens and further includes an efficient source of heat removal therefrom.

BRIEF SUMMARY OF THE INVENTION

A new and improved high power lamp structure having an efficient source of heat removal is provided. Briefly, in accordance with one embodiment of the present invention, an LED lamp structure is provided which has a plurality of LED die arranged in a multi-dimensional array, each of the LED die having a transparent substrate and a semiconductor material deposited on a surface of the substrate. Each of the LED die emits light from the top, bottom and sides of the die and is arranged on the multi-dimensional array so that the emitted light from each of the LED die does not contact another of the LED die. The LED lamp further includes a reflector for gathering and focusing of the emitted light from each of the LED die to approximate a high power LED lamp.

A principal advantage of the present invention is that a multi-LED lamp design is disclosed wherein several LED die are positioned so that the light emitted from each die does not conflict with light emitted from other LED die and is gathered and focused to approximate the 20 lumens output needed for a standard flashlight.

A second advantage of the present invention is that a LED lamp-like structure having a single, high power LED die as well as a source of heat removal therefrom can be used in a standard flashlight.

Still another advantage of the present invention is that an integrated phase change cooling concept, using a phase changing media for lighting products having LED devices, including flashlights, is disclosed, which enables the flashlight to be on for sustained periods of time, without a perceptible rise in temperature.

Still another advantage of the present invention is that an LED flashlight having light energy on a surface equivalent to that of a conventional filament incandescent bulb is disclosed.

Still another advantage of the present invention is that an LED lamp having enhanced thermal performance through the incorporation of electrically insulative, thermally conductive material is disclosed.

Still a further advantage of the present invention is that a flashlight is disclosed having longer lamp life, long battery life, and increased resistance to breakage of the bulb when the flashlight is dropped.

Still another advantage of the present invention is that a low cost assembly lighting product is disclosed for high volume appliance construction, particularly for flashlights of the hand-held variety.

Still another advantage of the present invention is that an LED equivalent to a conventional incandescent bulb, is disclosed for use in connection with the upgrade or retrofit of flashlight devices as a structural enhancement.

Still a further advantage of the present invention is that an enhanced lamp and lensing structure yielding good light flux area as compared to a conventional incandescent bulb flashlight is disclosed for use in the mass production of novel flashlight design.

Still a further advantage of the present invention is the use of integrated phase change cooling concepts, enabling an LED light source and phosphor structure, to be maintained at a constant fixed temperature for a sustained period of time, thus allowing the light source, and the hand held appliance, to maintain a constant light energy output level, due to the temperature maintenance characteristics of the phase change material(s).

BRIEF DESCRIPTION OF THE DRAWINGS

FIG. 12 is a side partial view of an alternate multi-angled LED array for use in a retrofit structure for the commercial flashlight of FIG. 1;

DETAILED DESCRIPTION OF THE INVENTION

Figure 1:
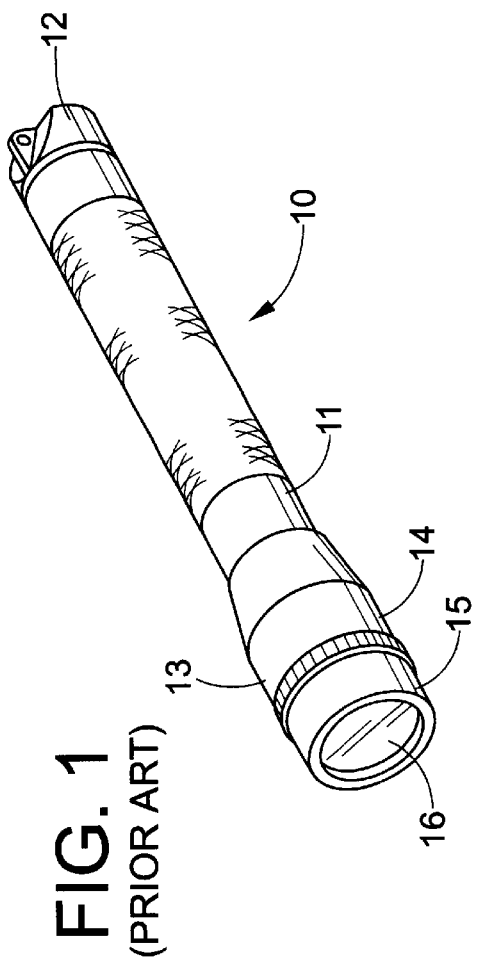
FIG. 1 (PRIOR ART) is a perspective view of a commercially available flashlight.

Referring now to the drawings, which illustrate a preferred embodiment of the invention only and are not intended to limit same, FIG. 1 (PRIOR ART) is an exploded perspective view of a conventional prior art flashlight, which is commercially available under the mark Mag Lite® from Mag Instrument, Inc. Although this flashlight is referenced herein by way of example, the teachings of the present invention are applicable to any flashlights known to those skilled in the art. The flashlight 10 of FIG. 1 includes a generally circular cylinder or barrel 11 enclosed at a first end by a tail cap 12 and having a head assembly 13 enclosing a second end thereof. The barrel 11 must be of an extent sufficient to enclose at least two cell batteries (not shown). The head assembly 13 comprises a head 14 to which is affixed a face cap 15 which retains a lens 16. The head assembly 13 has a diameter greater than that of the barrel 11 and is adapted to pass externally over the exterior of the barrel 11.

Figure 2:
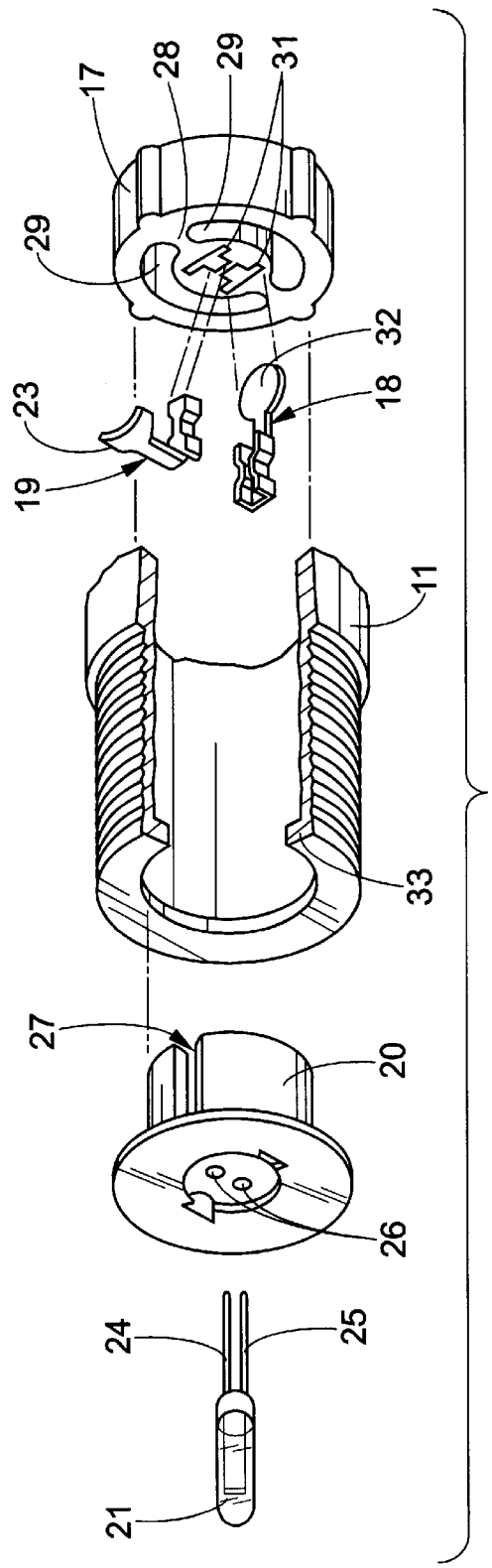
FIG. 2 (PRIOR ART) is an exploded perspective view illustrating the assembly of the lamp bulb holder assembly with respect to the barrel of the flashlight of FIG. 1.
Figure 3:
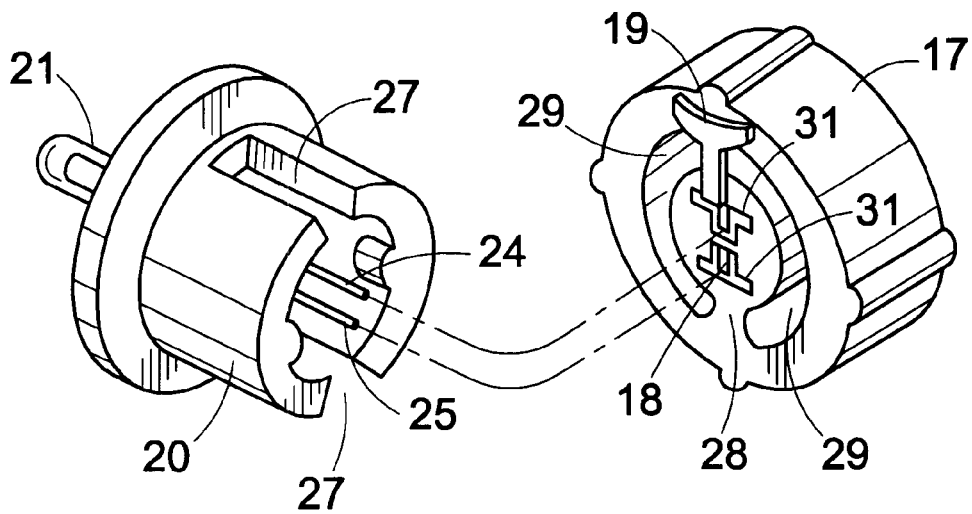
FIG. 3 (PRIOR ART) is an isolated partial perspective view illustrating the electro mechanical interface between electrical terminals of the lamp bulb and electrical conductors within the lamp bulb holder.
Figure 4:
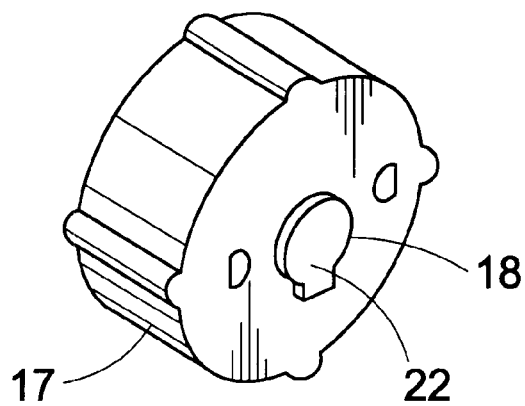
FIG. 4 (PRIOR ART) is a perspective view of a rearward surface of the lamp bulb holder of FIG. 3, illustrating a battery electrode contact terminal.

Referring next to FIGS. 2–4 (PRIOR ART), a preferred procedure for the assembly of a lower insulator receptacle 17, the center conductor 18, the side contact conductor 19, the upper insulator receptacle 20 and the miniature lamp bulb 21 may be described. The center conductor 18 is inserted through one of the slots 31 such that a substantially circular end section 22 extends outwardly from the rear surface of the lower insulator receptacle 17. The circular end section 22 is then bent, as shown in FIG. 4, to be parallel with the rearmost surface of the lower insulator receptacle 17 in a position centered to match the center electrode of the forwardmost of the batteries (not shown). The side contact conductor 19 is then inserted into the other slot 31 such that a radial projection 23 extends outwardly from the axial center of the lower insulator receptacle 17. It is to be noted that the radial projection 23 aligns with a web 28 between two arcuate recesses 29.

The lower insulator receptacle 17, with its assembled conductors, is then inserted in the rearward end of the barrel 11 and is slidably translated to a forward position adjacent the lip 33. The lamp electrodes 24, 25 are then passed through a pair of holes 21 formed through the forward surface of the upper insulator receptacle 20 so that they project outwardly from the rear surface as illustrated in FIG. 3. The upper insulator receptacle 20 containing the lamp bulb 21, is then translated such that the lamp electrodes 24, 25 align with receiving portions of the side contact conductor 19 and the center conductor 18, respectively. A pair of notches 27 formed in the upper insulator receptacle 20, are thus aligned with the webs 28 of the lower insulator receptacle 17. The upper insulator receptacle 20 is then inserted into the arcuate recesses 29 in the lower insulator receptacle 17 through the forward end of the barrel 11.

Electrical energy is conducted from the batteries (not shown) to the center conductor 18 which is coupled to the lamp electrode 25. After passing through the lamp bulb 21, the electrical energy emerges through the lamp electrode 24 which is coupled to the side contact conductor 19.

FIGS. 5–10 illustrate an LED lamp molded insert 30 for use in a retrofit structure for the commercial flashlight 10 of FIG. 1 or a newly-designed flashlight structure that enables the flashlight 10 to accept an LED lamp in place of a conventional filament incandescent bulb. This molded insert 30 is made of any material that has good thermal properties such as a thermally conducting, electrically insulating material 35 which may be injection or transfer molded. Preferably the material 35 is Plaskon® SMT-B-1, a product of Amoco Electronic Materials (Plaskon Division), which is a highly filled fast curing epoxide having good thermal and electrical insulation properties. Many other companies, including Dexter Hysol, make similar materials. The material 35 is preferably transfer molded into electrical feedthroughs and connections, thereby enabling the proper height and die attachment profiles to be attained. The molded LED insert 30 is preferably incorporated into a lamp bulb that is identical in form, fit and function to the lamp bulb 21, the difference being the use of the LED insert 30 in place of conventional tungsten filament in the bulb 21.

In the alternative, a highly thermally conductive epoxy may be used to form molded LED insert 30 and may be applied by machine and heat cured. The preferred thermally conductive epoxy blend is P280 from Bacon Industries, Inc.

Other suitable thermally conducting, electrically insulating materials 35 include glass, silicone, SiC, mineral substances, anodizing, oxidized metals such as oxides of tungsten and oxides of molybdenum, crystalline materials such as silicone, epoxy matrix, resistive materials such as RH, semiconductor devices, diamond or diamond matrix, ESD materials with good thermal properties, or Z-axis thermal material.

Figure 5:
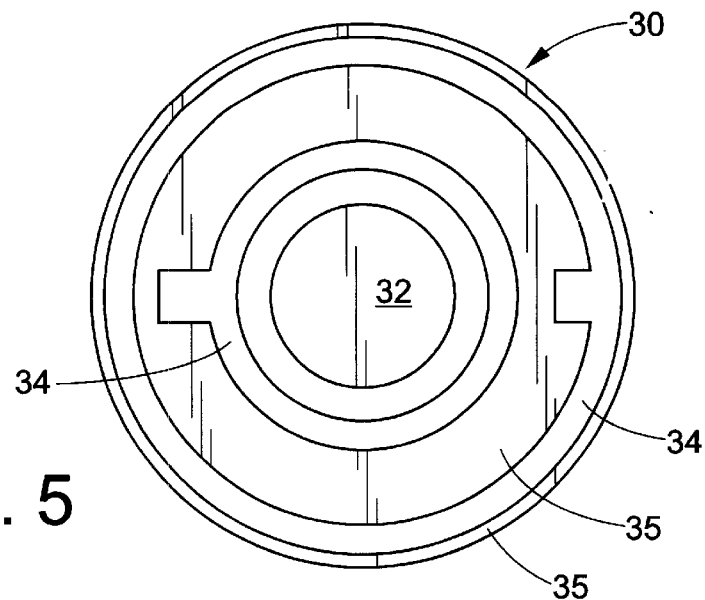
FIG. 5 is a top plan view of a molded insert for use in a retrofit structure for the commercial flashlight of FIG. 1.

FIG. 5 is a top plan view of the molded insert 30 for use in a flashlight. The molded insert 30 includes a die mounting area 32 formed from thermally conducting material, and an optional light reflective insert in the molding process, and wire bond areas 34, which are placed as metal structures and inserted prior to the molding process. These wire bonding and/or chip placement areas 34 may be formed after the fact by elaborate metallization processing. In the preferred embodiment, a metal structure is placed in the mold cavity, and the polymer molding compound, i.e., the thermally conducting, electrically insulating material 35 flows around it to anchor it in place. Copper with nickel plating, or many other lead frame materials well-known in the art may be used as the wire bonding area 34, including kovar with nickel plating or gold plating. The electrical connections and electrical feedthroughs are formed prior to the molding process. The foregoing concepts are well-known in the art of injection and transfer molding.

Figure 6:
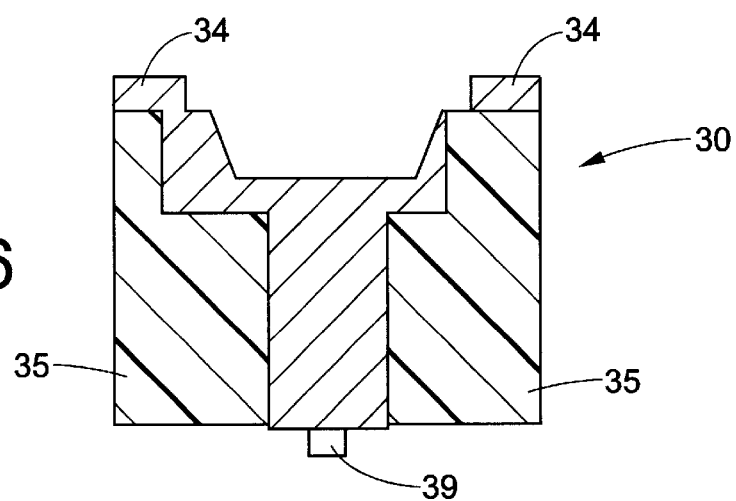
FIG. 6 is a cutaway side view of the molded insert of FIG. 5.
Figure 7:
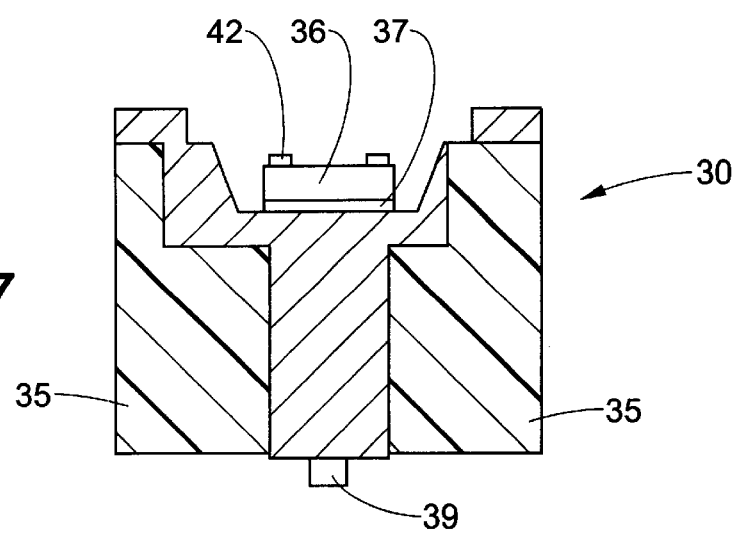
FIG. 7 is the molded insert of FIG. 5 illustrating attachment of an LED die.

FIGS. 6 and 7 depict cutaway side views of the molded insert of FIG. 5. Each of these figures illustrates a single high-powered LED die 36 as the desired light source and an electrical connection 39.

Figure 8:
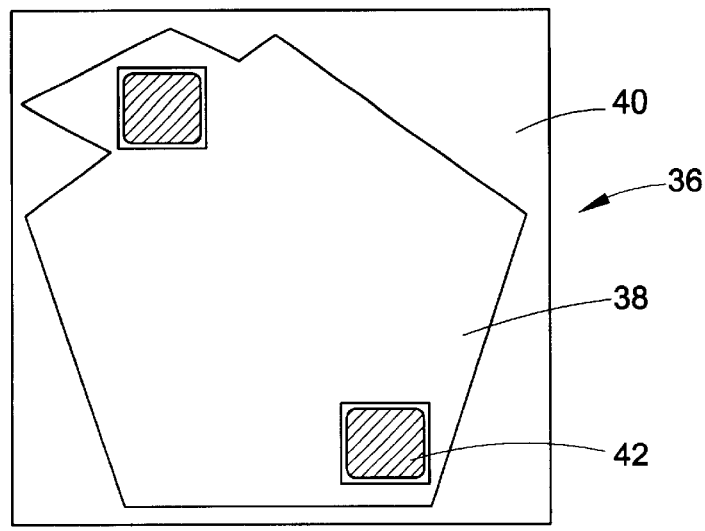
FIG. 8 is a top view of the wafer deposition side of the die of FIG. 7 illustrating a patterned GaN area.

With particular reference to FIG. 8, the LED die structure 36 includes a GaN deposition layer 38 deposited in the form of a polygonal shape having more than four sides. This concept of an odd-sided polygonal diffusion area for optimal liberation of light is disclosed in copending application Ser. No. 09/542,037 for Flip Chip LED Apparatus filed Apr. 3, 2000. An odd number of sides corresponding to the deposited gallium nitride layer results in an optimal liberation of light as confirmed by an optical model of the LED.

Figure 9:
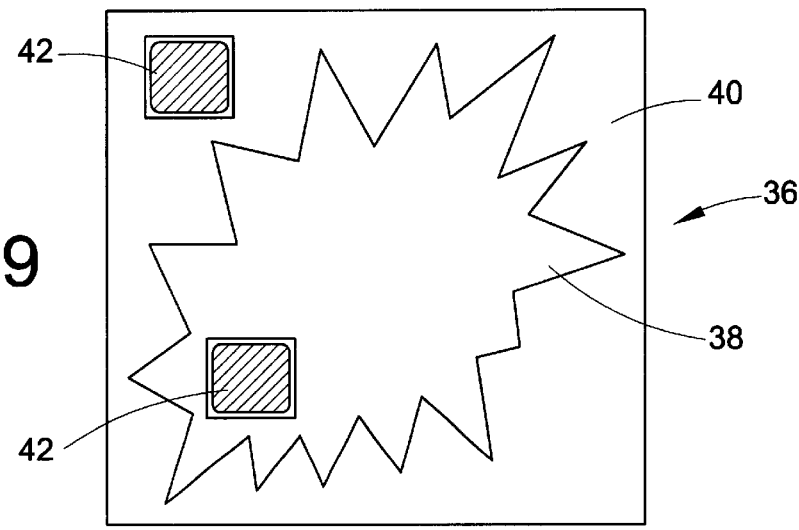
FIG. 9 is a top view of the wafer deposition side of the die of FIG. 7 illustrating a patterned GaN area.
Figure 10:
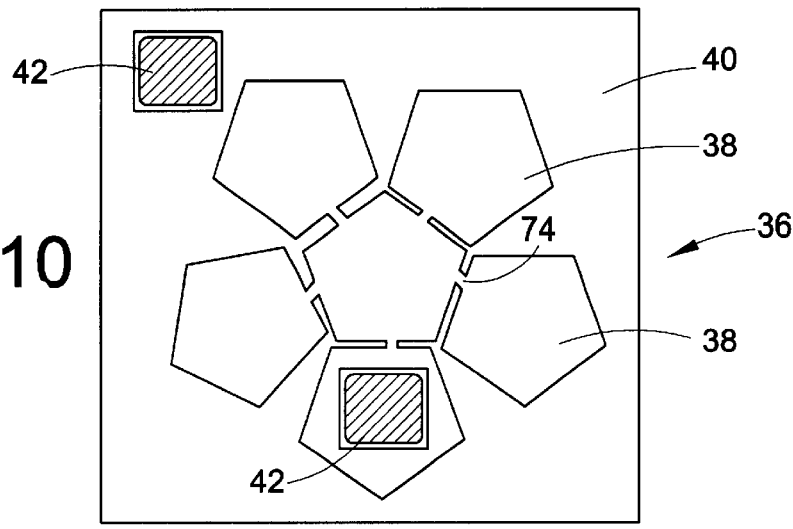
FIG. 10 is a top view of the wafer deposition side of the die of FIG. 7 illustrating a patterned GaN area.

In the embodiment of FIG. 9, an odd-sided polygonal diffusion GaN layer 38 area is deposited for optimum liberation of light. Further, in the embodiment of FIG. 10, multi-site polygonal diffusion areas of GaN 38 are deposited and electrically connected by tabs 74. FIG. 7 illustrates the molded insert 30, including the LED die 36 attached by a solder or silver-filled epoxy 37. The solder or silver-filled epoxy is of the type well-known to those skilled in the art. Suitable examples include lead solder, lead/tin solder, gold/tin solder as well as many others known to those of ordinary skill in the art.

Micro ball grid array ($\mu\mu$BGA) bonding pads 42 are attached to a top surface of a substrate 40. The $\mu\mu$BGA bonding pad 42 typically comprises one or more layers of metals such as gold, nickel, aluminum, platinum, chromium, indium, and/or tin, for example. In the preferred embodiment, the bonding pad 42 comprises titanium/tungsten/nickel/gold (Ti/W/Ni/Au) with the Ti/W ranging from 500 to 5000 angstroms, the Ni ranging from 5000 to 20000 angstroms, and the gold ranging from 300 to 1500 angstroms.

Substrate 40 may comprise a substantially transparent material such as sapphire (aluminum oxide), for example. "Substantially transparent" is intended to mean sufficiently transparent to transmit a useful amount of light therethrough. Exemplary materials which are useful for this purpose include sapphire or spinel. "Spinel" refers to a group of minerals having the general formula $AB_2O_4$ wherein A is magnesium, ferrous ion, zinc, manganese or a combination thereof, and B is aluminum, ferric ion, chromium, or a combination thereof In the preferred embodiment, the substrate is comprised of sapphire, a single crystal aluminum oxide ($Al_2O_3$) generally used for semiconductor processing.

The thickness of the substrate 40 is not critical and will depend upon the particular application. The thickness typically ranges from about 80 to about 500 microns but may be ground thinner depending upon the application.

Figure 11:
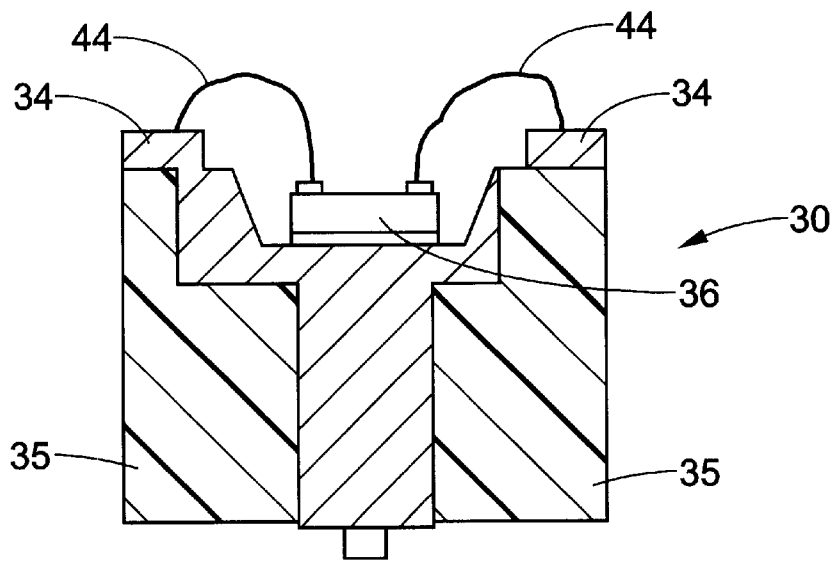
FIG. 11 is the molded insert of FIG. 7 illustrating wire bond interconnection of the LED.

FIG. 11 illustrates the use of wire bonds 44 for connection of the LED die 36 to the molded insert 30. The wire bonds 44 are of the type well-known to those of ordinary skill in the art and preferably include gold ball—stitch bonds or aluminum stitch—stitch bonds. Either may be used. One is form fit and functionally equivalent to the other.

Figure 13:
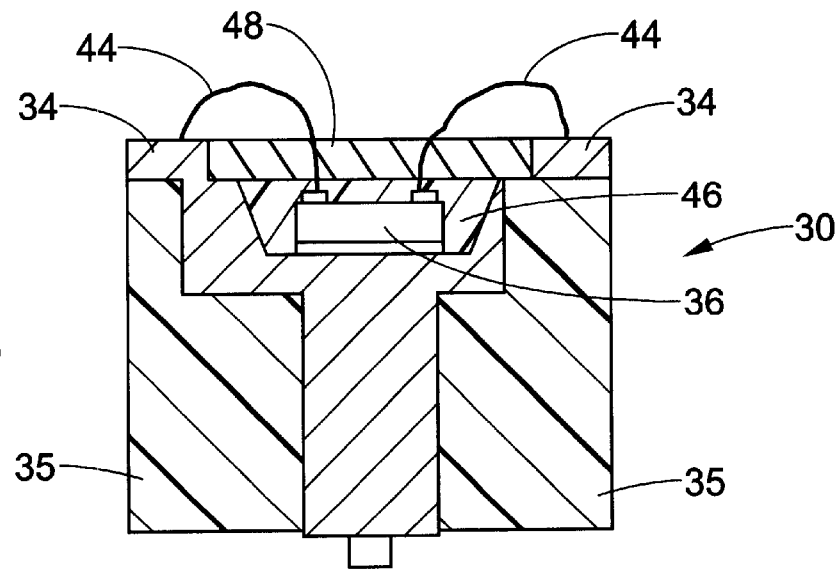
FIG. 13 is the molded insert of FIG. 11, including RTV material and phosphor material.

FIG. 13 depicts a light conversion phosphor material 46 and RTV sealing material 48 applied to the molded insert 36. Phosphor application is used to convert blue, UV, or other light from the LED, to other colors, including white light, using phosphors, a practice which is well-known to those skilled in the art. Variations and phosphor thickness of the phosphor layer translate into variations in light out which in turn affects the LED quality, purity, intensity, color, and distribution. The RTV sealing material 48 is preferably silicone rubber and may alternatively be other materials identified with particularity in copending application Ser. No. 09/548,440 for LED Lead Frame Assembly, filed Apr. 13, 2000. All of the materials 46, 36 need to be UV-resistant to damage from the light.

FIG. 12 is a multi-LED lamp 50 showing multiple single die 52 as the desired light source. The multi-LED die lamp 50 enables the use of more than one LED to approximate a high power LED structure. FIG. 12 illustrates a 5-LED geometric design that optimizes power output of the lamp 50 and increases light output by managing the light ray paths from the top and side edges of the GaN LED die 52. In the embodiment of FIG. 12, five LED die 52 are illustrated. However, the actual number of LEDs used in the design may be less than 5 or greater than 5 depending upon the vendor retrofit technology being used. For example, some flashlights have a 20 lumens output. Others, having krypton or other halogen bulbs, have a much greater light output. The exact number of LED die 52 used in the multi-LED lamp 50 varies depending on the product. Approximately 50% of the light emitted from the die 52 is side-emitted light and, therefore, must be collected efficiently to produce desired results.

The lamp 50 is comprised of a multi-sided, multi-dimensional array 51, which emits light at angled ray trace paths. In the preferred embodiment, the array is a four-sided, three-dimensional head 51 of a trapezoidal shape. The head 51 is formed of material such as that used to form wire bond areas 34. The light is collected on a reflector 53 that produces a uniform high light intensity and density, comparable to a conventional incandescent bulb. In the preferred embodiment, the die 52 are arranged on the head 51 so that the side-emitted light is not blocked from the gathering process to the reflector 53—that is, the light cannot be emitted to another non-reflecting area and consequently be lost from the gathering process. In this regard, pedestals (not shown), recessions (not shown), or any other geometric positioning of the die, may be implemented in the design to allow for emission of light to a reflector 53 while, at the same time, preventing blocking of the light by associated LED die 52. Although a three-dimensional trapezoidal head 51 is shown here, those skilled in the art would appreciate that the head 51 could also be a two-dimensional structure and could be of various geometric configurations other than a trapezoid.

The reflector 53 is formed by application of a polymer material such as PMMA (polymethyl methacrylate) or any polymer having a lower optical index than $Al_2O_3$. Optionally, a mirrored surface can be formed on the reflector 53 in place of the polymer to achieve the desired effect by, e.g., sputtering or vapor deposition. The polymer material used to form the reflector 53 can be applied using a pipette or any other auto dispensing equipment known in the art.

Figure 19:
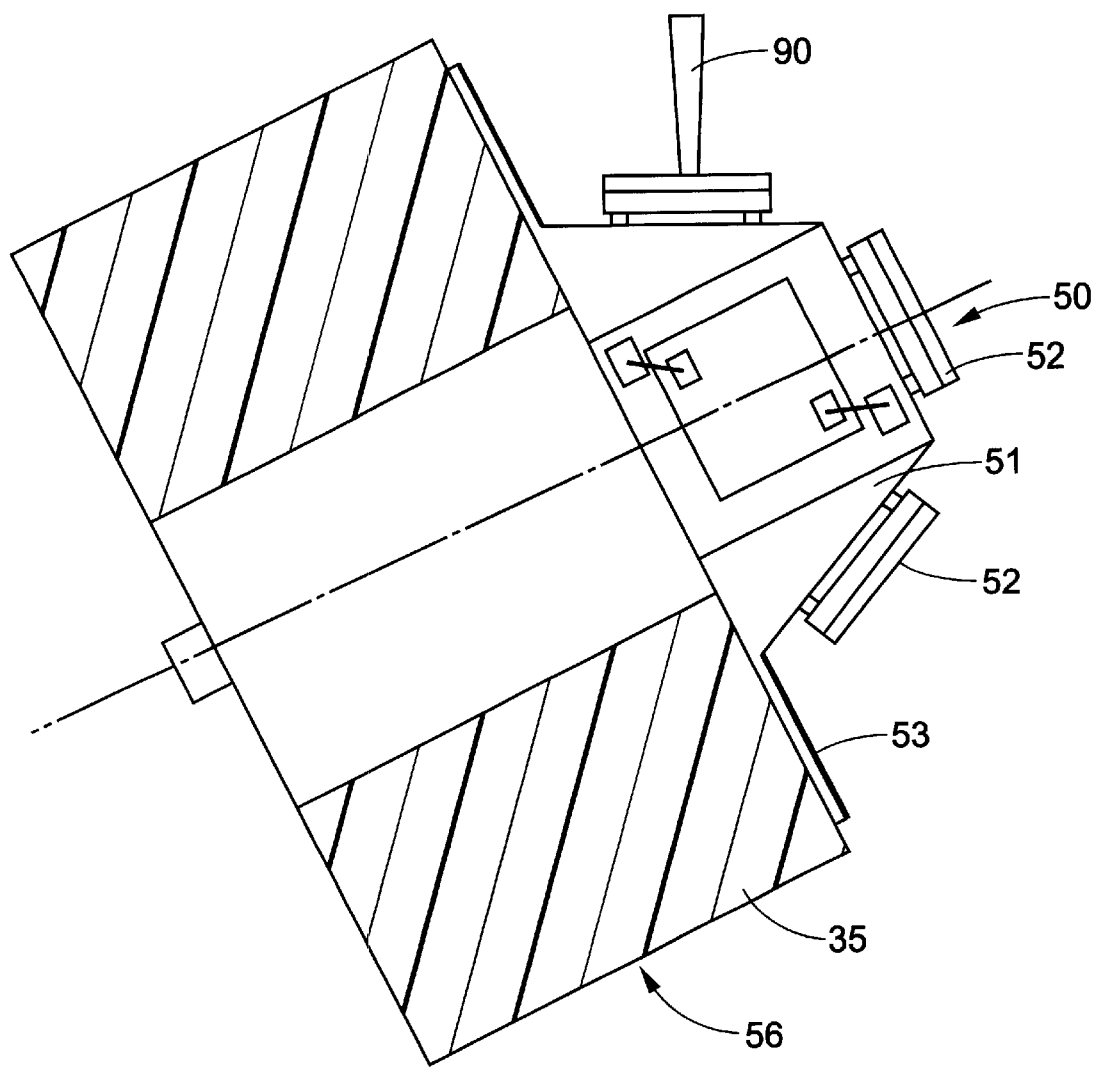
FIG. 19 is a side partial view of an LED assembly process for the multi-angled LED array of FIG. 12.

The LED die 52 may be placed on a flex circuit and processed flat and thereafter applied to the trapezoidal head 51, or may be placed on the head 51 directly. For example, FIG. 19 is a side partial view of a preferred LED assembly process for the multi-LED lamp 50. The LED die 52 are placed flat by a machine (not shown) while the LED lamp head 51 is angled. The machine (not shown) is preferably a highly-automated pick and place machine. A die placement tool 90 is used to position each die 52 on the LED lamp head 51. As illustrated in FIG. 19, the multi-LED lamp 50 is positioned off axis for die assembly. The die 52 are positioned on the sides of the lamp head 51 as illustrated in FIG. 19. The multi-LED lamp 50 is then turned ninety degrees so that the LED die 52 can be placed on the top of lamp head 51. Conventional wire bonding, flip chip (μμμBGA) technology such as IBM C4, or a combination thereof may be used. If C4 technology is used, a thermal underfilling (not shown) may be necessary for improved thermal connection of the LED die 52. Thermal underfilling is well-known to those skilled in the art and is typically an epoxy material impregnated with thermally enhancing materials such as powdered diamond (0.25 to 5 micron size range), alumina, or aluminum nitride, in the 0.25 to 5 micron size range.

Similar to the molded LED insert 30, the transfer molded multi-LED lamp 50 also includes a molded insert 56 comprised of wire bond areas 34 and thermally conducting, electrically insulating material 35 as best illustrated in FIG. 12. The five-faced head structure 51 may be integral to the molded insert 56 of the multi-LED lamp 50 or may be inserted into the structure using a silver epoxy, or any solder of the type well-known to those of skill in the art for final connection to the battery area.

The height of the head 51 may be adjusted slightly for tolerance variations as the prior art Mag Light® embodiment, as well as many other lights, have a turning of the lens assembly to slightly adjust the light focus point. Further, reflective areas (not shown) of silver or other highly reflective metal such as aluminum may be used to enhance the secondary reflections of the GaN LEDs 52. For example, any area where the light hits should be metallized with silver or aluminum (for the UV or Blue light) using many known techniques such as E-beam evaporation, sputtering, spray metal plasma, bonded fouls and the like. Electrical connections 29 are fed through, and molded in the trapezoidal head 51 to allow for application of electrical power.

The placement of the LED die 52 in the lamp head 51 is critical for repeatability from appliance to appliance, and thus mandates exact placement of the LED die. In this regard, IBM C4, also known as flip chip bonding and μμBGA bumping technology is preferred as compared to wire bond technology, since the placement of the die 52 with the pick-and-place machine is not the determining factor for the final positioning of the die 52. The melted solder has a well-known and well-characterized surface tension which snaps or moves the die 52 to a neutral force position using the surface tension energy. The "snap to grid" feature of the C4 technology, using the surface tension of the solder, provides excellent repeatability.

The GaN technology could be optimized by directing light out the transparent back side of the die 52 (i.e., the sapphire side), basically optimizing a flip chip format. This allows the entire backside to become the light-emitter, as opposed to the topside, which includes metal-blinded areas. This technology is described in detail in copending application Ser. No. 09/542,037 for Flip Chip LED Apparatus filed Apr. 3, 2000.

Moreover, as can be readily appreciated by one skilled in the art, each of the LED die 52 of head 51 can be energized or deenergized in a predetermined order to effect dimming of the LED lamp 50 as appropriate.

Figure 14:
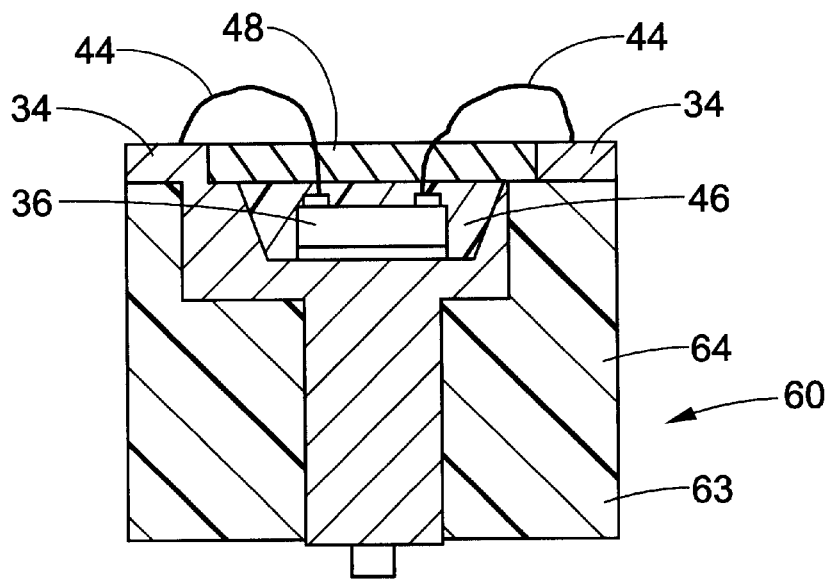
FIG. 14 is the molded insert of FIG. 13, including phase change material.

In each of the embodiments illustrated in the present invention, as light is emitted, heat builds in the lamp due to the low light efficiency of the LED die 36, 52. To correct for this problem and thus allow for long-term use of the light without phosphor degradation, a phase change material 64 is further disclosed to enhance the cooling of the LED lamp and flashlight structure, etc. In particular, FIG. 14 is a cutaway side view of another embodiment of a molded LED insert 60 of the present invention. Molded insert 60 of FIG. 14 includes a metal mesh (or foam) 63 of a finned metal with a high surface area and high thermal conductivity, that is impregnated with the phase change material 64. These phase change materials 64 may be waxes, eutectic salts and other materials that are known to those of skill in the art. Phase change materials 64 have a wide variety of temperature ranges and melting ranges. Combination of different phase change materials may also be used in the present invention. In this regard, the phase change material 64 may be a dual or tri-range phase change material composed of a combination of phase change materials. The mesh 63 is connected to the central thermal path of the LED structure, and then impregnated or filled with a phase change material 64 to produce a long-acting, low temperature bulb-like structure. The phase change material 64 replaces the Plaskon transfer molding material (i.e., the electrically insulating, thermally conducting material 35) in form and fit.

Figure 15:
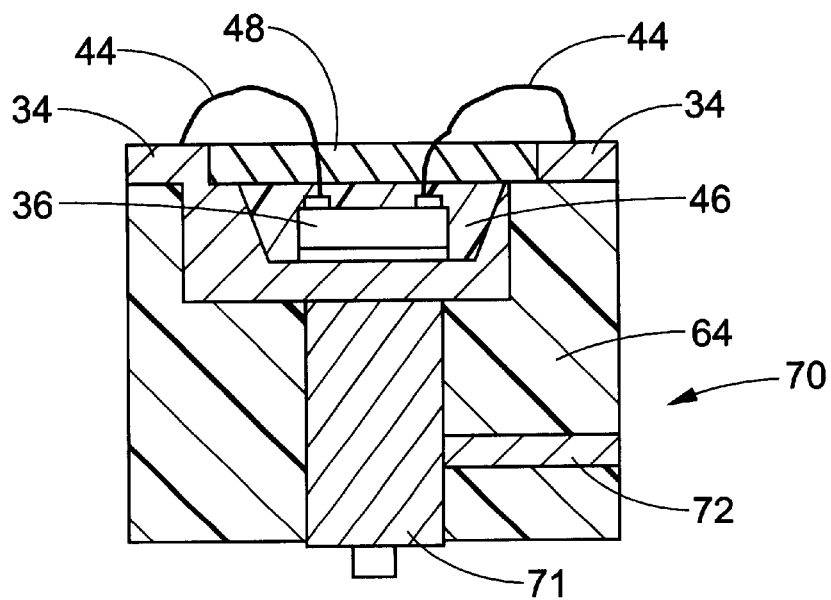
FIG. 15 is an alternate embodiment of the molded insert of FIG. 14.

In the alternate embodiment illustrated in FIG. 15, the molded insert 70 includes phase change material 64 in the post of the LED frame 71. Optionally, heat pipes 72, and metal foams can be incorporated into the molded insert 70 for additional dissipation of heat. It is well-known that heat pipes 72 move the heat by a capillary-like action away from the hot areas to the cooler areas. Heat pipes 72 do not replace the need for phase change materials 64.

Figure 16:
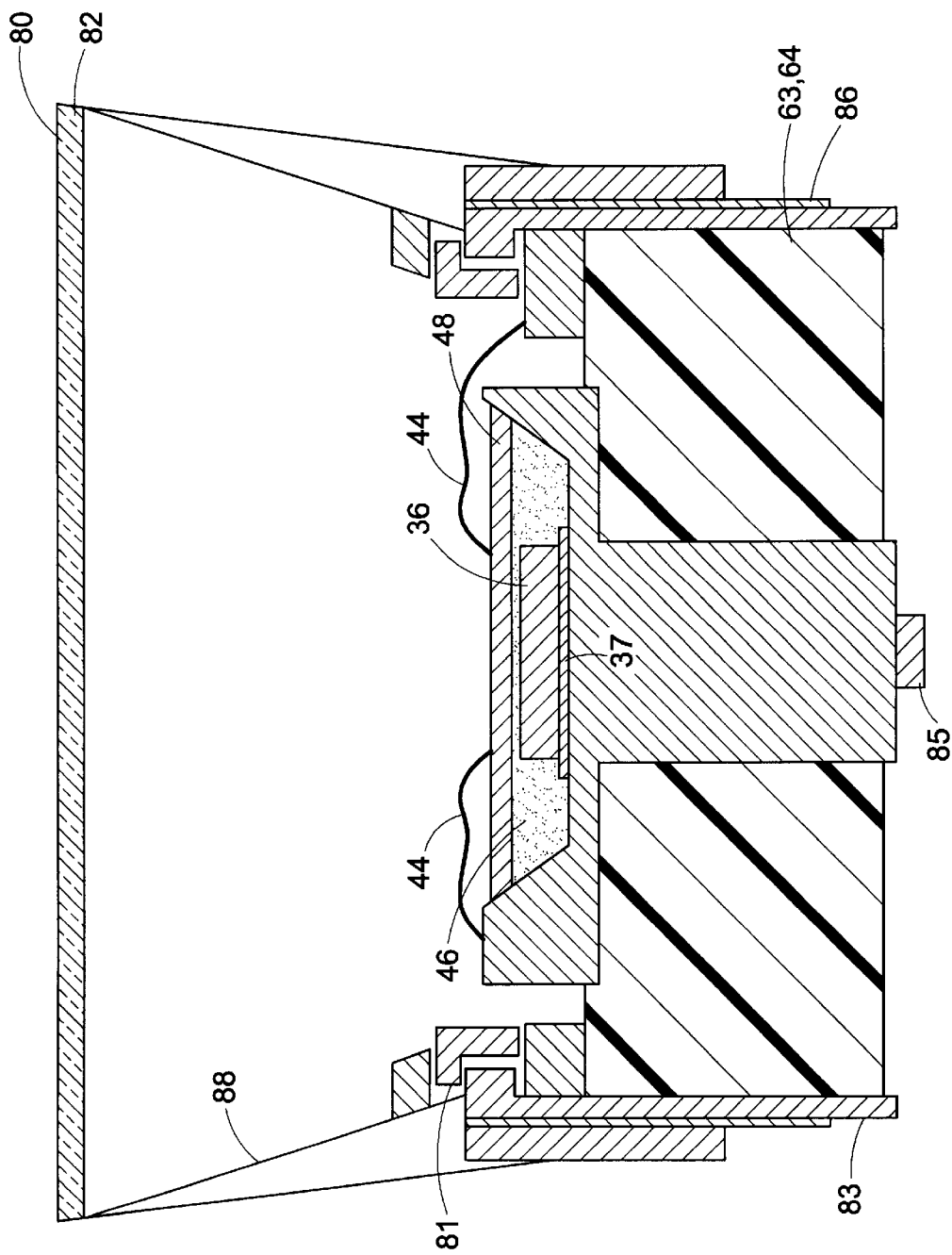
FIG. 16 is a cutaway partial view of a flashlight assembly of the present invention.
Figure 17:
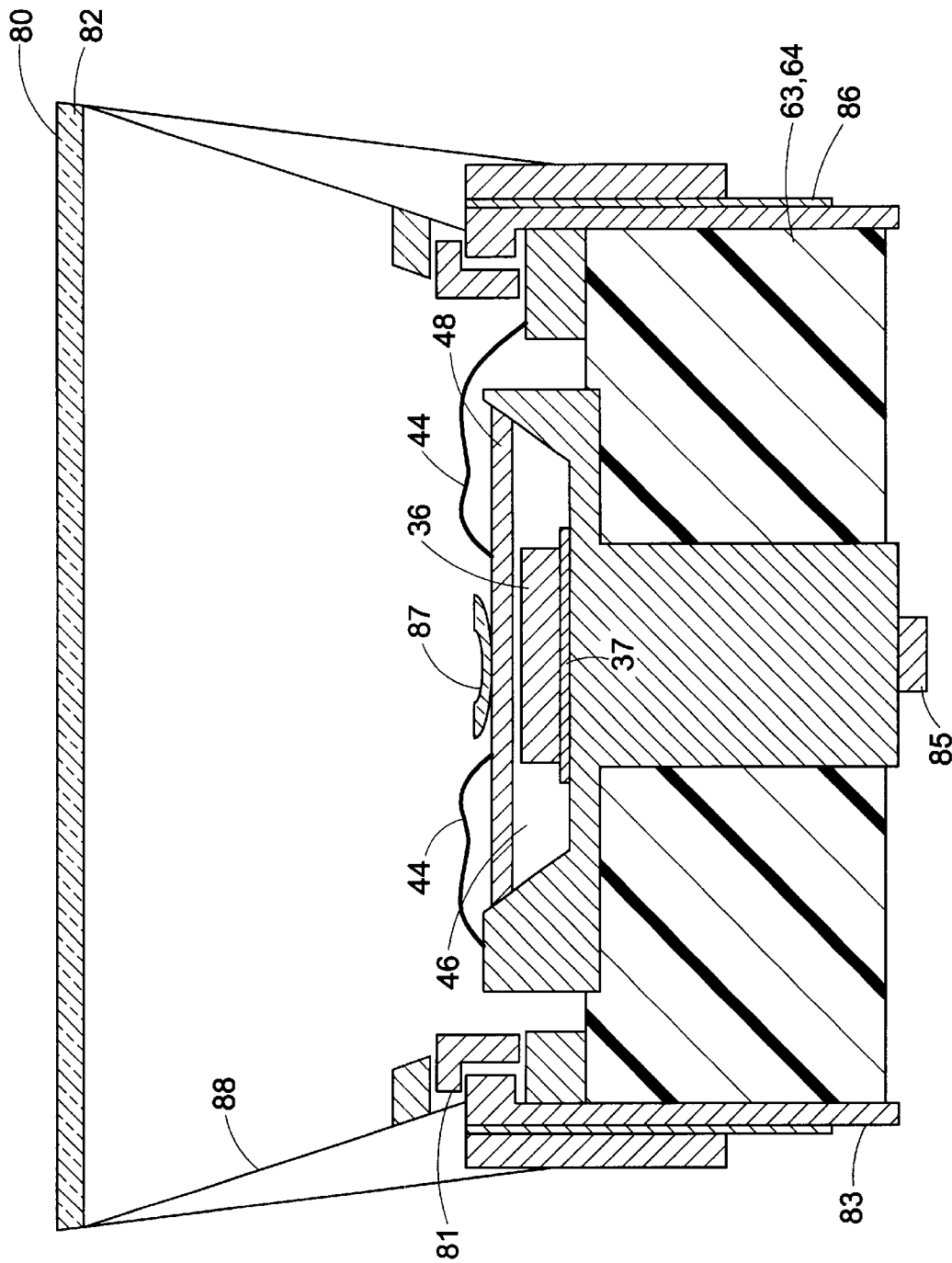
FIG. 17 is a cutaway partial view of an alternate embodiment of the flashlight assembly of the present invention.

FIGS. 16 and 17 illustrate cutaway partial views of a flashlight assembly 80 of the present invention. In this regard, FIGS. 16 and 17 illustrate a focus and on-off switch embodiment, including a switch on/off assembly 81, lens 82, housing 83 (having a negative path) and filled with phase change material 64 (including metal mesh 63). Moreover, a battery connect 85 (having a positive thermal path) and screw focus adjustment 86 on the housing 83 is illustrated as well as a light reflector baffle 88. FIG. 17 includes an optional focus-aiding lens 87, thereby allowing for easier realm of focus from light to light. FIGS. 16 and 17 also show a reflector assembly, including a phosphor material 46, RTV material 48 and LED die 36 (preferably formed in a flip chip arrangement) to collect the light and refocus the light in a uniform collimated manner. This technique is described in detail in copending application Ser. No. 09/542,037 for Flip Chip LED Apparatus, filed Apr. 3, 2000.

Figure 18:
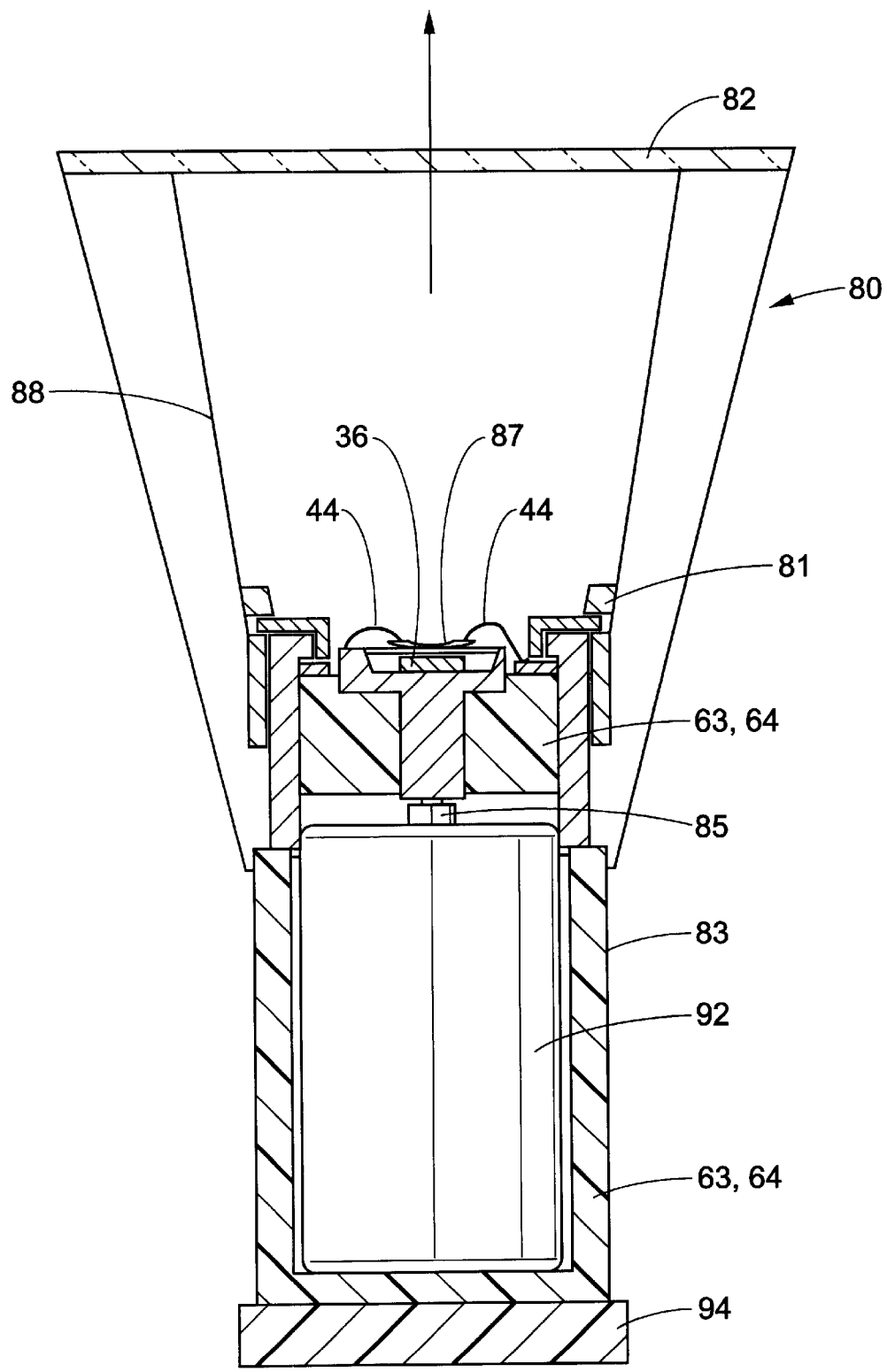
FIG. 18 is a cutaway view of the flashlight assembly of the present invention.

FIG. 18, a cutaway view of the flashlight assembly of the present invention, depicts additional or optional locations for insertion of phase change materials 64 into the flashlight assembly 80 of FIGS. 16 and 17 to aid in the cooling process. For example, in FIG. 18 the phase change material 64 (including metal mesh 63) is shown in the housing 83 surrounding the battery(s) 92. FIG. 18 further depicts battery (s) 92 and a retaining cap 94.

This invention has been described with reference to the preferred embodiment. Obviously, modifications and alterations will occur to others upon a reading and understanding of this specification. For example, this invention could similarly be used in other lighting products such as head lights, spot lights and the like. The invention is intended to include all such modifications and alterations insofar as they come within the scope of the appended claims and the equivalents thereof.

What is claimed is:

1. An LED lamp comprising:
   a plurality of LED die arranged in a multi-dimensional array, each of the LED die having a transparent substrate and a semiconductor material deposited on a surface of the substrate, each of the LED die emitting light in a plurality of directions including from the sides of the die, each of the LED die arranged on the multi-dimensional array so that the emitted light from the sides of each of the LED die does not contact another of the LED die; and at least one reflecting surface arranged relative to the plurality of LED die comprising the multi-dimensional array such that the arrangement of the LED die and the at least one reflecting surface cooperate to direct light emitted from the sides of the LED die outward from the LED lamp;

wherein the multi-dimensional array is formed in a three-dimensional trapezoidal shape.

2. The LED lamp of claim 1 wherein the reflector is formed of a polymer having a lower optical index than that of the transparent substrate.

3. The LED lamp of claim 1 wherein the reflector has a mirrored surface.

4. The LED lamp of claim 1 wherein the LED die are attached to the multi-dimensional array using a solder or a silver-filled epoxy.

5. The LED lamp of claim 1 wherein the transparent substrate is sapphire ($Al_2O_3$).

6. The LED lamp of claim 1 wherein at least one of the LED die comprises wire bonds for attachment of the LED die to the multi-dimensional array.

7. The LED lamp of claim 1 wherein at least one of the LED die is formed in a flip chip arrangement.

8. The LED lamp of claim 1 wherein the LED die are in a wire-bonded format, a flip chip format or a combination thereof.

9. The LED lamp of claim 1 wherein the multi-dimensional array is comprised of a thermally conducting, electrically insulating epoxide.

10. The LED lamp of claim 1 further comprising a molded insert formed of a thermally conducting, electrically insulating material, the reflector formed on a surface of the molded insert, the molded insert serving as a source of heat removal from the LED lamp.

11. The LED lamp of claim 10 wherein the multi-dimensional array is attached to a surface of the molded insert.

12. The LED lamp of claim 10 wherein the molded insert is formed of a phase change material.

13. The LED lamp of claim 1 wherein each of the LED die further comprises fluorescent or phosphorescent material disposed over the LED die.

14. The LED lamp of claim 13 wherein the LED die emit light at predetermined wavelengths which is partially converted by the fluorescent or phosphorescent material into another wavelength to provide a white light.

15. The LED lamp of claim 13 further comprising an RTV layer disposed over the fluorescent or phosphorescent material.

16. The LED lamp of claim 1 wherein each of the LED die is deenergized in a predetermined order to effect dimming of the lamp.

17. The LED lamp of claim 1 for use in a flashlight.

18. The LED lamp of claim 1 wherein the semiconductor material deposited on a surface of the substrate includes:

semiconductor material deposited in the form of one or more odd-sided polygons including fewer than ten sides each.

* * * * *